US010686434B2

(12) United States Patent
Chern et al.

(10) Patent No.: US 10,686,434 B2
(45) Date of Patent: Jun. 16, 2020

(54) INPUT/OUTPUT CIRCUIT (71) Applicant: TAIWAN SEMICONDUCTOR MANUFACTURING COMPANY, LTD., Hsinchu (TW)

(72) Inventors: Chan-Hong Chern, Palo Alto, CA (US); Tsung-Ching Huang, Mountain View, CA (US); Chih-Chang Lin, San Jose, CA (US); Ming-Chieh Huang, San Jose, CA (US); Fu-Lung Hsueh, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/206,577

(22) Filed: Nov. 30, 2018

(65) Prior Publication Data
US 2019/0097615 A1 Mar. 28, 2019

Related U.S. Application Data (63) Continuation of application No. 15/244,152, filed on Aug. 23, 2016, now Pat. No. 10,187,046, which is a (Continued)

(51) Int. Cl.
*H03K 5/131* (2014.01)
*H03K 5/1534* (2006.01)
(Continued)

(52) U.S. Cl.
CPC ........... *H03K 5/1534* (2013.01); *H03K 5/131* (2013.01); *H03K 17/167* (2013.01);
(Continued)

(58) Field of Classification Search
CPC ............................. H03K 5/131; H03K 5/1534
See application file for complete search history.

(56) References Cited

U.S. PATENT DOCUMENTS 5,877,647 A 3/1999 Vajapey et al.
8,299,831 B2 10/2012 Sohn
(Continued)

FOREIGN PATENT DOCUMENTS

TW I266480 11/2006

OTHER PUBLICATIONS

Office Action dated Sep. 12, 2016, from corresponding application No. TW 104139611.
(Continued)

*Primary Examiner* — Hai L Nguyen
(74) *Attorney, Agent, or Firm* — Hauptman Ham, LLP (57) ABSTRACT

A circuit includes a first power node configured to carry a first voltage having a first voltage level, an output node, a node coupled between the first power node and the output node, and a contending transistor coupled between the node and a second power node configured to carry a second voltage having a second voltage level. The circuit generates a signal at the output node that ranges between the first voltage level and a third voltage level, the contending transistor couples the node with the second power node responsive to the signal, a difference between the first voltage level and the second voltage level has a first magnitude, a difference between the first voltage level and the third voltage level has a second magnitude, and the second magnitude is a multiple of the first magnitude having a value greater than one.

20 Claims, 9 Drawing Sheets

Related U.S. Application Data continuation of application No. 14/630,934, filed on Feb. 25, 2015, now Pat. No. 9,450,573.

(51) Int. Cl.
   *H03K 17/16* (2006.01)
   *H03K 19/003* (2006.01)
   *H03K 17/687* (2006.01)
   *H03K 5/00* (2006.01)

(52) U.S. Cl.
   CPC ... *H03K 17/6872* (2013.01); *H03K 19/00315* (2013.01); *H03K 2005/00019* (2013.01); *H03K 2005/00058* (2013.01)

(56) References Cited

U.S. PATENT DOCUMENTS

| | | | |
|---|---|---|---|
| 8,405,442 B2 | 5/2013 | Chen | |
| 8,436,671 B2 | 5/2013 | Chern et al. | |
| 8,610,488 B2 | 12/2013 | Yu et al. | |
| 8,625,240 B2 | 1/2014 | Chung et al. | |
| 8,674,744 B2* | 3/2014 | Smith | H03K 19/01852 326/81 |
| 8,847,659 B1 | 9/2014 | Lan et al. | |
| 9,214,933 B2 | 12/2015 | Chern | |
| 9,450,573 B2 | 9/2016 | Chern et al. | |
| 9,780,647 B2 | 10/2017 | Roth et al. | |
| 10,187,046 B2* | 1/2019 | Chern | H03K 5/131 |
| 2006/0158224 A1 | 7/2006 | Yan-Bin | |
| 2008/0061831 A1 | 3/2008 | Chen | |
| 2012/0019302 A1 | 1/2012 | Chern et al. | |
| 2012/0032731 A1 | 2/2012 | Huang et al. | |
| 2012/0044008 A1 | 2/2012 | Chern et al. | |
| 2013/0222015 A1 | 8/2013 | Chern et al. | |
| 2014/0266386 A1 | 9/2014 | Huang et al. | |

OTHER PUBLICATIONS

Research Report dated Sep. 10, 2016 from corresponding application No. TW 104139611.

* cited by examiner

INPUT/OUTPUT CIRCUIT

PRIORITY CLAIM

The present application is a continuation of U.S. application Ser. No. 15/244,152, filed Aug. 23, 2016, now U.S. Pat. No. 10,187,046, issued Jan. 22, 2019, which is a continuation of U.S. application Ser. No. 14/630,934, filed Feb. 25, 2015, now U.S. Pat. No. 9,450,573, issued Sep. 20, 2016, which is incorporated herein by reference in its entirety.

RELATED APPLICATION

The instant application is related to U.S. application Ser. No. 14/189,653, filed Feb. 25, 2014, now U.S. Pat. No. 9,214,933, issued Dec. 15, 2015. The entire contents of the above-referenced application are incorporated by reference herein.

BACKGROUND

As semiconductor technology develops, an integrated circuit sometimes has a signal operating at a voltage swing lower than that of a signal suitable for an external circuit, such as another integrated circuit or one or more discrete electrical components. An input/output (I/O) circuit is often used in the integrated circuit in order to convert the low voltage swing signal from the integrated circuit to a high voltage swing signal recognizable by the external circuit. In some applications, the integrated circuit includes low voltage transistors and high voltage transistors. Low voltage transistors are sometimes also referred to as core (or thin-gate) transistors and are configured to handle the low voltage swing signal. High voltage transistors are sometimes also referred to as I/O (or thick-gate) devices and are configured to handle the large voltage swing signal. Core transistors are designed to be sufficiently large to handle the low voltage swing signal, but are usually not large enough to handle the large voltage swing signal. On the other hand, compared with low-voltage transistors, I/O transistors are usually larger and occupy a larger die space.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with one or more embodiments, an I/O circuit includes pull-up cascode driver transistors, pull-down cascode driver transistors, and one or more contending circuits. The contending circuits are usable to prevent a voltage stress applied to the pull-up cascode driver transistors or the pull-down cascode driver transistors when the I/O circuit is used to drive a large load.

Figure 1:
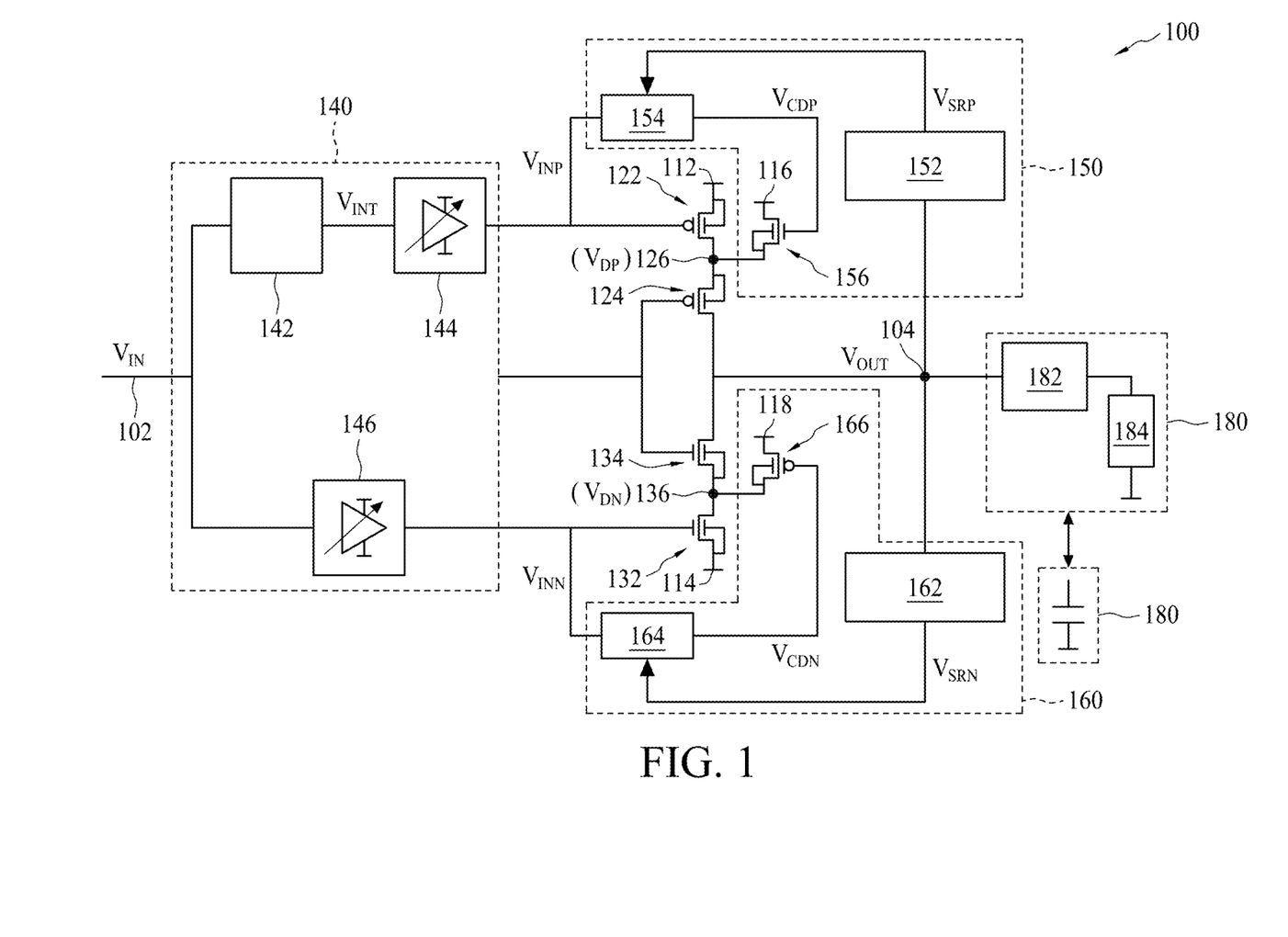
FIG. 1 is a circuit diagram of an example I/O circuit in accordance with some embodiments.

FIG. 1 is a circuit diagram of an example I/O circuit 100 in accordance with some embodiments. I/O circuit 100 includes an input node 102 and an output node 104. Circuit 100 is configured to receive an input signal $V_{IN}$ at input node 102 and to generate an output signal $V_{OUT}$ at output node 104. Input signal $V_{IN}$ has a voltage level ranging from a zero reference level (i.e., 0 volt for circuit 100) to a predetermined voltage level $V_{DD}$. Output signal $V_{OUT}$ has a voltage level ranging from the zero reference level to a predetermined voltage level $K \cdot V_{DD}$. K is a positive ratio greater than 1. $V_{DD}$ is a predetermined, non-zero value above the zero reference level. In some embodiments, $V_{DD}$ ranges from 0.65 Volts (V) to 1.20 V. Input signal $V_{IN}$ is a logic signal usable to indicate a logic low value when input signal $V_{IN}$ is set at the zero reference level and to indicate a logic high value when input signal $V_{IN}$ is set at $V_{DD}$. Output signal $V_{OUT}$ is a logic signal usable to indicate a logic high value ($K \cdot V_{DD}$) when input signal $V_{IN}$ is set at the zero reference level and to indicate a logic low value (the zero reference level) when input signal $V_{IN}$ is set at $V_{DD}$. In FIG. 1, output signal $V_{OUT}$ is logically complementary to input signal $V_{IN}$, in some embodiments, and time-shifted by a time delay attributable to the operation of I/O circuit 100.

I/O circuit 100 includes a first power node 112, a second power node 114, a third power node 116, and a fourth power node 118. I/O circuit 100 also includes a first pull-up driver transistor 122 and a second pull-up driver transistor 124 coupled in series between power node 112 and output node 104; a first pull-down driver transistor 132 and a second pull-down driver transistor 134 coupled in series between power node 114 and output node 104; a biasing circuit 140 configured to control the pull-up driver transistors 122 and 124 and the pull-down driver transistors 132 and 134 based on input signal $V_{IN}$; and contending circuits 150 and 160 configured to contend with driver transistors 122 or 132 under certain operation conditions. Output node 104 of I/O circuit 100 is coupled with an internal load 182, including at least an I/O pad and an electrostatic discharge (ESD) protection circuit, and an external load 184. Internal load 182 and external load 184 are collectively represented by a capacitive load 180 in this application.

Driver transistor 122 is a P-type transistor having a source coupled with power node 112. Driver transistor 124 is a P-type transistor having a source coupled with a drain of driver transistor 122 and a drain coupled with output node 104. The node corresponding to the source of the driver transistor 124 and the drain of the driver transistor 122 is labeled as node 126. Driver transistors 122 and 124 are also known as cascode transistors. Driver transistor 132 is an N-type transistor having a source coupled with power node 114. Driver transistor 134 is an N-type transistor having a source coupled with a drain of driver transistor 132 and a drain coupled with output node 104. The node corresponding to the source of the driver transistor 134 and the drain of the driver transistor 132 is labeled as node 136. Driver transistors 132 and 134 are also known as cascode transistors.

Biasing circuit 140 is coupled with input node 102 and gates of driver transistors 122, 124, 132, and 134. Biasing circuit 140 is configured to turn off driver transistors 122 and 124 and turn on driver transistors 132 and 134 responsive to input signal $V_{IN}$ being at the logical high value; and to turn on driver transistors 122 and 124 and turn off driver transistors 132 and 134 responsive to input signal $V_{IN}$ being at the logical low value. In some embodiments when K is 2, the voltage level at the gates of driver transistors 124 and 134 are set at $V_{DD}$. Biasing circuit 140 also includes a level shifter 142 and a delay unit 144 between input node 102 and the gate of driver transistor 122, and a delay unit 146 between input node 102 and the gate of driver transistor 132. Level shifter 142 is configured to generate an intermediate signal $V_{INT}$ by up-shifting input signal $V_{IN}$ by $V_{DD}$. Delay unit 144 is configured to generate the signal to be fed to the gate of driver transistor 122 by delaying the intermediate signal $V_{INT}$. Delay unit 146 is configured to generate the signal to be fed to the gate of driver transistor 132 by delaying the input signal $V_{IN}$.

Delay units 144 and 146 are usable to synchronize the timing of transitions of the bias voltage for the gates of driver transistors 122 and 132. In some embodiments, the delay periods of delay units 144 and 146 are tunable according to one or more control signals, either in an analog or digital format. In some embodiments, the delay periods of delay units 144 and 146 are predetermined and fixed when delay units 144 and 146 are fabricated.

In some applications, the capacitive load 180 causes the output signal $V_{OUT}$ to have a slew rate slower than the slew rate of the signal at the gate of driver transistor 122 or the slew rate of the signal at the gate of driver transistor 132. Therefore, in some occasions, when driver transistor 122 is turned on, a voltage difference between node 126 and output signal $V_{OUT}$ is greater than $V_{DD}$. Also, in some occasions, when driver transistor 132 is turned on, a voltage difference between node 136 and output signal $V_{OUT}$ is greater than $V_{DD}$. However, in some applications, driver transistors 124 and 134 are not designed to repetitively withstand a source-to-drain voltage greater than $V_{DD}$. The issue caused by voltage over-stress to driver transistors 124 and 134 are also known as a "hot-carrier-injection" issue. In some applications, the "hot-carrier-injection" issue causes degradation of the reliability of I/O circuit 100 when the slew rate of the output signal $V_{OUT}$ is greater than 10 ns.

Contending circuit 150 is configured to pull the drain of driver transistor 122 toward a third voltage level at third power node 116 during a time period after the driver transistor 122 is set to pull the drain of the driver transistor 122 toward the first voltage level at third power node 116. The time period is determined based on a slew rate of output signal $V_{OUT}$, and the third voltage level is less than the first voltage level. As a result, a source-to-drain voltage of driver transistor 124 when driver transistor 122 is turned on is mitigated by contending circuit 150. In some embodiments, a voltage difference between the first voltage level and the third voltage level is equal to or less than $V_{DD}$. In some embodiments, the first voltage level is $2 \cdot V_{DD}$, and the third voltage level is $V_{DD}$.

Contending circuit 150 includes a slew rate detection circuit 152 configured to generate a feedback signal $V_{SRP}$ based on a rising edge of output signal $V_{OUT}$, a control circuit 154 configured to generate a control signal $V_{CDP}$ based on a signal $V_{INP}$ at the gate of driver transistor 122 and feedback signal $V_{SRP}$, and a contending transistor 156 between the drain of the driver transistor 122 (i.e., node 126) and third voltage node 116. Contending transistor is an N-type transistor in the embodiment depicted in FIG. 1 and has a gate configured to receive the control signal $V_{CDP}$. In some embodiments, contending transistor 156 has a driving capability equal to or less than driver transistor 122.

Contending circuit 160 includes a slew rate detection circuit 162 configured to generate a feedback signal $V_{SRN}$ based on a falling edge of output signal $V_{OUT}$, a control circuit 164 configured to generate a control signal $V_{CDN}$ based on a signal $V_{INN}$ at the gate of driver transistor 132 and feedback signal $V_{SRN}$, and a contending transistor 166 between the drain of the driver transistor 132 (i.e., node 136) and fourth voltage node 118. Contending transistor is a P-type transistor in the embodiment depicted in FIG. 1 and has a gate configured to receive the control signal $V_{CDN}$. In some embodiments, contending transistor 166 has a driving capability equal to or less than driver transistor 132.

In some embodiments, one of the contending circuit 150 or contending circuit 160 is omitted. In some embodiments, slew rate detection circuit 152 and slew rate detection circuit 162 are implemented as an integrated slew rate detection circuit.

Figure 2A:
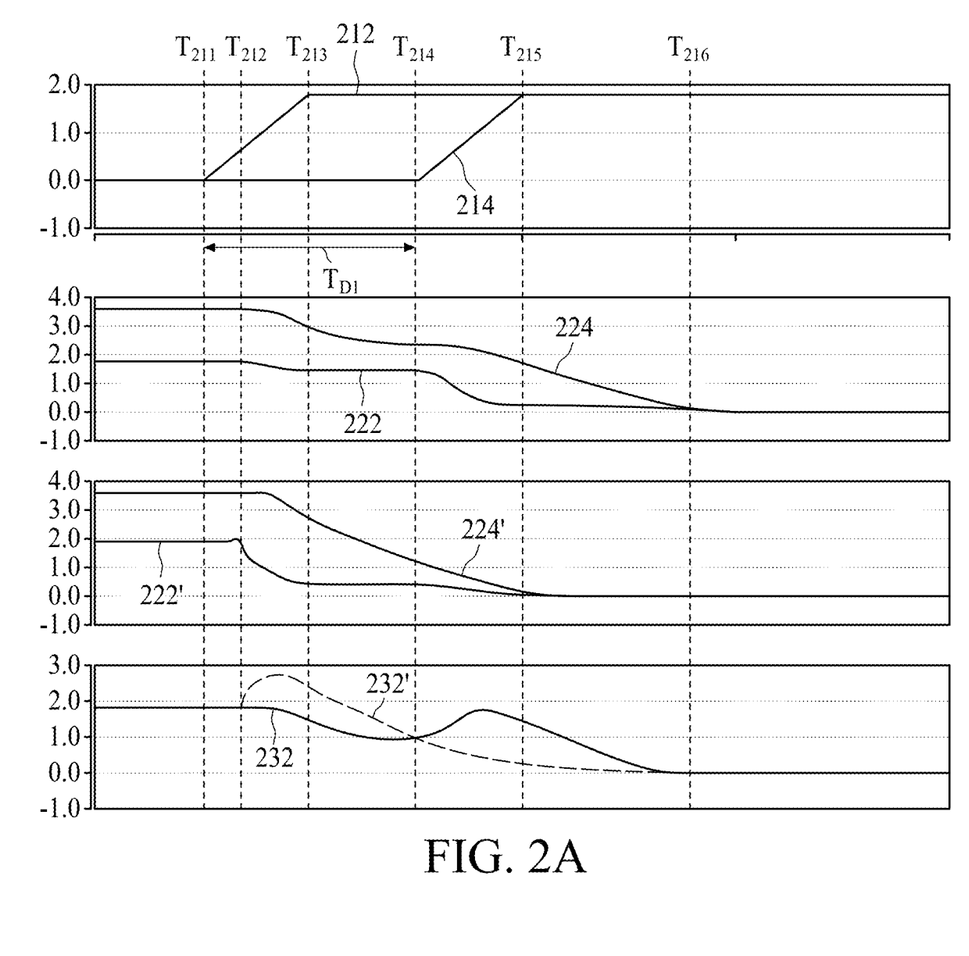
FIGS. 2A and 2B are timing diagrams of voltage signals at various nodes of the I/O circuit of FIG. 1 in accordance with some embodiments.

FIG. 2A is a timing diagram of voltage signals at various nodes of the I/O circuit 100 when input signal $V_{IN}$ transitions from the logical low value to the logical high value in accordance with some embodiments. FIG. 2A is illustrated in conjunction with some components depicted in FIG. 1 and the reference numbers assigned thereof.

In FIG. 2A, curve 212 represents signal $V_{INN}$ at the gate of driver transistor 132; curve 214 represents signal $V_{CDN}$ at the gate of contending transistor 166; curve 222 represents a signal $V_{DN}$ at drain of driver transistor 132; and curve 224 represents signal $V_{OUT}$ at output node 104. Curve 232 represents the voltage difference between signal $V_{OUT}$ and signal $V_{DN}$.

Moreover, curve 222' represents a signal $V_{DN}$ at drain of driver transistor 132 in an alternative I/O circuit having a configuration without contending circuit 160; curve 224' represents signal $V_{OUT}$ at output node 104 in such alternative I/O circuit; and curve 232' represents the voltage difference between signal $V_{OUT}$ and signal $V_{DN}$ in this alternative I/O circuit.

At time $T_{211}$, biasing circuit causes signal $V_{INN}$ (curve 212) to transit from the zero reference level to voltage $V_{DD}$ (which is set to be 1.8 V in this embodiment). At time $T_{212}$, the voltage level of signal $V_{INN}$ (curve 212) starts to turn on driver transistor 132. As a result, output signal $V_{OUT}$ (curve 224) starts to transition from $2 \cdot V_{DD}$ (which is set to be 3.6 V in this embodiment) to the zero reference level. A slew rate of the falling edge of output signal $V_{OUT}$ depends on the driving capability of driver transistors 132 and 134 and the capacitive load 180. Based on a slew rate of the falling edge of output signal $V_{OUT}$ (curve 224) detected by slew rate detection circuit 162, control circuit 164 keeps signal $V_{CDN}$ (curve 214) at the zero reference level for the time being. Therefore, contending transistor 166 is turned on responsive to signal $V_{CDN}$, and signal $V_{DN}$ (curve 222) remains at a voltage level close to $V_{DD}$ as a result of current contention between contending transistor 166 and driver transistor 132.

At time $T_{213}$, the voltage level of signal $V_{INN}$ (curve 212) reaches $V_{DD}$. At time $T_{214}$, based on a slew rate of the falling edge of output signal $V_{OUT}$ (curve 224) detected by slew rate detection circuit 162, control circuit 164 causes signal $V_{CDN}$ (curve 214) to transition from the zero reference level to $V_{DD}$. The rising edge of signal $V_{CDN}$ is generated by delaying the rising edge of signal $V_{INN}$ for a delay period $T_{D1}$, where the delay period $T_{D1}$ is determined by control circuit 164 based on the feedback signal $V_{SRN}$ from slew rate detection circuit 162. The voltage level of signal $V_{CDN}$ (curve 214) starts to turn off contending transistor 166. As contending transistor 166 is being gradually turned off by signal $V_{CDN}$, signal $V_{DN}$ (curve 222) starts to transition toward the zero reference level by driver transistor 132.

At time $T_{215}$, the voltage level of signal $V_{CDN}$ (curve 212) reaches $V_{DD}$, contending transistor 166 is fully turned off, and the voltage level of signal $V_{DN}$ (curve 222) has reached about $0.1 \cdot V_{DD}$ above the zero reference level. At time $T_{216}$, the voltage level of output signal $V_{OUT}$ (curve 224) reaches the zero reference level.

As illustrated by curve 232, a voltage difference between output signal $V_{OUT}$ and signal $V_{DN}$ is controlled to be less than or equal to $V_{DD}$.

In comparison with the embodiment described in conjunction with curves 212, 214, 222, 224 and 232, the operation of the alternative I/O circuit having a configuration without contending circuit 160 is illustrated in conjunction with curves 212, 222', 224', and 232'. Responsive to the rising edge of signal $V_{INN}$ (curve 212), signal $V_{DN}$ (curve 222') begins to transition from $V_{DD}$ to the zero reference level at time $T_{212}$. The voltage level of signal $V_{DN}$ (curve 222') reaches about $0.1 \cdot V_{DD}$ above the zero reference level at time $T_{213}$. Output signal $V_{OUT}$ (curve 224') begins to transition from $2 \cdot V_{DD}$ to the zero reference level at time $T_{212}$ and reaches the zero reference level right after time $T_{215}$. In the alternative I/O circuit, a voltage difference between output signal $V_{OUT}$ and signal $V_{DN}$ exceeds $V_{DD}$ at time $T_{212}$ and is not pulled back to be under $V_{DD}$ until about the half way between time $T_{213}$ and time $T_{214}$.

Comparing curves 224 and 224', it takes longer for the output signal $V_{OUT}$ of the I/O circuit with contending circuit 160 to transition from $2 \cdot V_{DD}$ to the zero reference level responsive to the rising edge of signal $V_{INN}$ than the alternative I/O circuit without contending circuit 160. In some embodiments, contending circuit 160 is configured to keep the responsive speed of output signal $V_{OUT}$ within a predetermined design specification. However, comparing curves 232 and 232', the I/O circuit with contending circuit 160 has a much lower risk to stress or damage driver transistor 134 than the alternative I/O circuit without contending circuit 160.

Figure 2B:
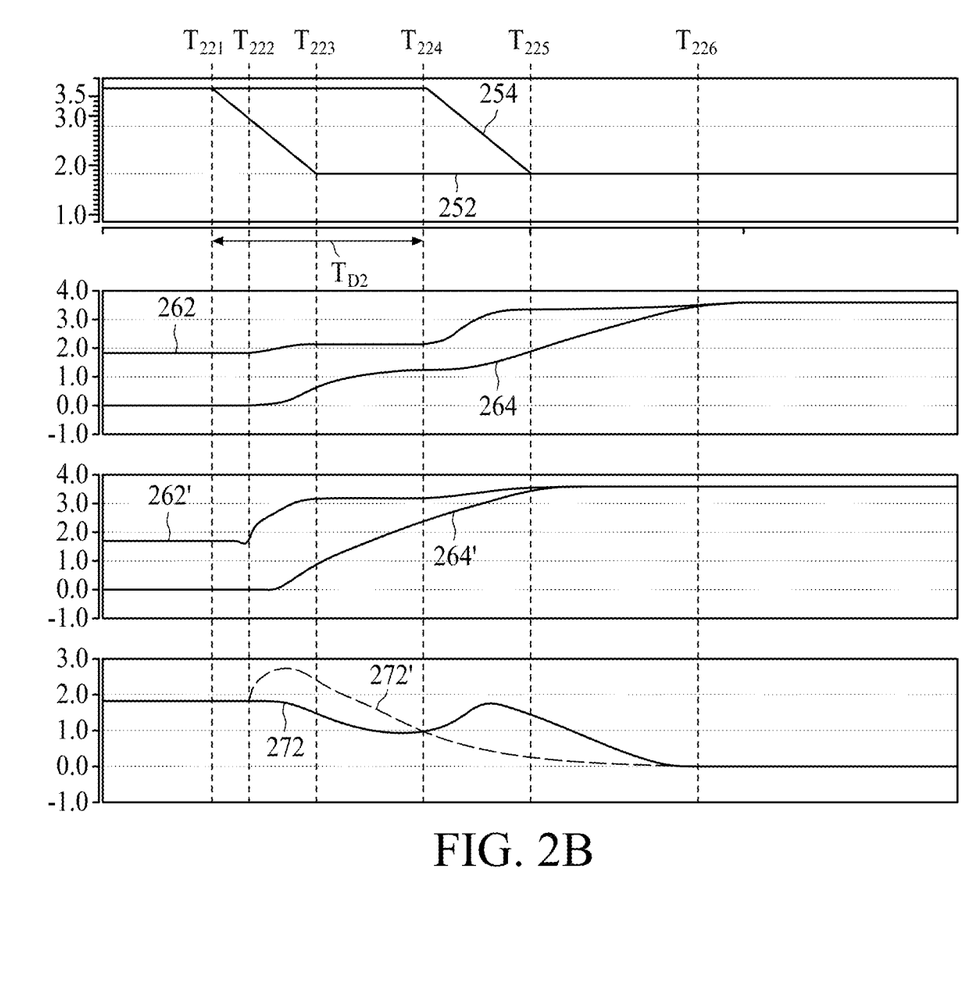

FIG. 2B is a timing diagram of voltage signals at various nodes of the I/O circuit 100 when input signal $V_{IN}$ transitions from the logical high value to the logical low value in accordance with some embodiments. FIG. 2B is illustrated in conjunction with some components depicted in FIG. 1 and the reference numbers assigned thereof.

In FIG. 2B, curve 252 represents signal $V_{INP}$ at the gate of driver transistor 122; curve 254 represents signal $V_{CDP}$ at gate of contending transistor 156; curve 262 represents a signal $V_{DP}$ at drain of driver transistor 122; and curve 264 represents signal $V_{OUT}$ at output node 104. Curve 272 represents the voltage difference between signal $V_{DP}$ and signal $V_{OUT}$.

Moreover, curve 262' represents a signal $V_{DP}$ at drain of driver transistor 122 in an alternative I/O circuit having a configuration without contending circuit 150; curve 264' represents signal $V_{OUT}$ at output node 104 in such alternative I/O circuit; and curve 272' represents the voltage difference between signal $V_{DP}$ and signal $V_{OUT}$ in this alternative I/O circuit.

At time $T_{221}$, biasing circuit causes signal $V_{INP}$ (curve 252) to transition from $2 \cdot V_{DD}$ to $V_{DD}$. At time $T_{222}$, the voltage level of signal $V_{INP}$ (curve 252) starts to turn on driver transistor 122 and output signal $V_{OUT}$ (curve 254) thus starts to transition from the zero reference level to $2 \cdot V_{DD}$. A slew rate of the rising edge of output signal $V_{OUT}$ depends on the driving capability of driver transistors 122 and 124 and the capacitive load 180. Based on a slew rate of the rising edge of output signal $V_{OUT}$ (curve 264) detected by slew rate detection circuit 152, control circuit 154 keeps signal $V_{CDP}$ (curve 254) at $2 \cdot V_{DD}$ for the time being. Therefore, contending transistor 156 is turned on responsive to signal $V_{CDP}$, and signal $V_{DP}$ (curve 262) remains at a voltage level close to $V_{DD}$ as a result of current contention between contending transistor 156 and driver transistor 122.

At time $T_{223}$, the voltage level of signal $V_{INP}$ (curve 252) reaches $V_{DD}$. At time $T_{224}$, based on a slew rate of the rising edge of output signal $V_{OUT}$ (curve 264) detected by slew rate detection circuit 152, control circuit 154 causes signal $V_{CDP}$ (curve 254) to transition from $2 \cdot V_{DD}$ to $V_{DD}$. The falling edge of signal $V_{CDP}$ is generated by delaying the falling edge of signal $V_{INP}$ for a delay period $T_{D2}$, where the delay period $T_{D2}$ is determined by control circuit 154 based on the feedback signal $V_{SRP}$ from slew rate detection circuit 152. The voltage level of signal $V_{CDP}$ (curve 254) starts to turn off contending transistor 156. As contending transistor 156 is being gradually turned off by signal $V_{CDP}$, signal $V_{DP}$ (curve 262) starts to transition toward $2 \cdot V_{DD}$ by driver transistor 122.

At time $T_{225}$, the voltage level of signal $V_{CDP}$ (curve 254) reaches $V_{DD}$, contending transistor 156 is fully turned off, and the voltage level of signal $V_{DP}$ (curve 262) has reached about $0.1 \cdot V_{DD}$ below $2 \cdot V_{DD}$. At time $T_{226}$, the voltage level of output signal $V_{OUT}$ (curve 264) reaches $2 \cdot V_{DD}$.

As illustrated by curve 272, a voltage difference between signal $V_{DP}$ and output signal $V_{OUT}$ is controlled to be no greater than $V_{DD}$.

Similar to the comparison between an I/O circuit with contending circuit 160 and an I/O circuit without contending circuit 160 depicted in FIG. 2A, responsive to the falling edge of signal $V_{INP}$ (curve 252), signal $V_{DP}$ (curve 262') begins to transition from $V_{DD}$ to $2 \cdot V_{DD}$ at time $T_{222}$. The voltage level of signal $V_{DP}$ (curve 262') reaches about $0.1 \cdot V_{DD}$ below $2 \cdot V_{DD}$ at time $T_{223}$. Output signal $V_{OUT}$ (curve 264') begins to transition from the zero reference level to $2 \cdot V_{DD}$ at time $T_{222}$ and reaches $2 \cdot V_{DD}$ right after time $T_{225}$. In the alternative I/O circuit, a voltage difference between signal $V_{DP}$ and output signal $V_{OUT}$ exceeds $V_{DD}$ at time $T_{222}$ and is not pulled back to be under $V_{DD}$ until about the half way between time $T_{223}$ and time $T_{224}$.

Figure 3A:
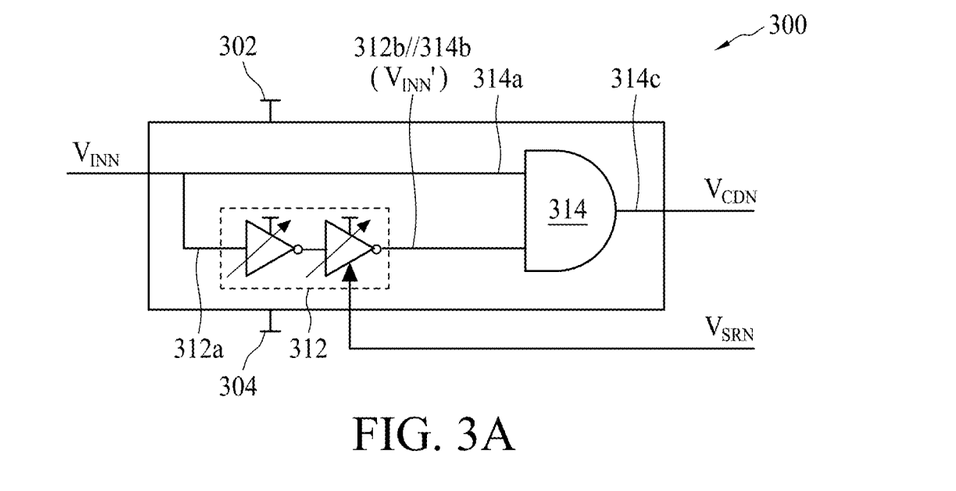
FIG. 3A is a circuit diagram of an example control circuit usable in the I/O circuit of FIG. 1 in accordance with some embodiments.

FIG. 3A is a circuit diagram of an example control circuit 300 usable as control circuit 164 in the I/O circuit 100 of FIG. 1 in accordance with some embodiments. Components that are the same or similar to those depicted in FIG. 1 are given the same reference numbers, and detailed description thereof is thus omitted.

Control circuit 300 includes a first power node 302 and a second power node 304. In some embodiments, power node 302 is configured to receive a voltage having the voltage level the same as that of power node 118 (FIG. 1, $V_{DD}$), and power node 304 is configured to receive a voltage having the voltage level the same as that of power node 114 (the zero reference level). Components of control circuit 300 are operated in a power domain defined by power node 302 and power node 304.

Control circuit 300 includes an adjustable delay circuit 312 and an AND gate 314. Adjustable delay circuit 312 has an input node 312a configured to receive signal $V_{INN}$ and an output node 312b. Adjustable delay circuit 312 is configured to generate a delayed signal $V_{INN}'$ by delaying the signal $V_{INN}$ based on the feedback signal $V_{SRN}$. In some embodiments, when the output signal $V_{OUT}$ has a slower slew rate, adjustable delay circuit 312 is set to have a greater delay.

AND gate 314 having a first input 314a, a second input 314b, and an output 314c. First input 314a of the AND gate 314 is configured to receive the signal $V_{INN}$, and second input 314b of the AND gate 314 is configured to receive the delayed signal $V_{INN}'$ from the adjustable delay circuit 312. Output 314c of the AND gate 314 is coupled with, and configured to provide control signal $V_{CDN}$ to, the gate of the contention transistor 166.

Figure 3B:
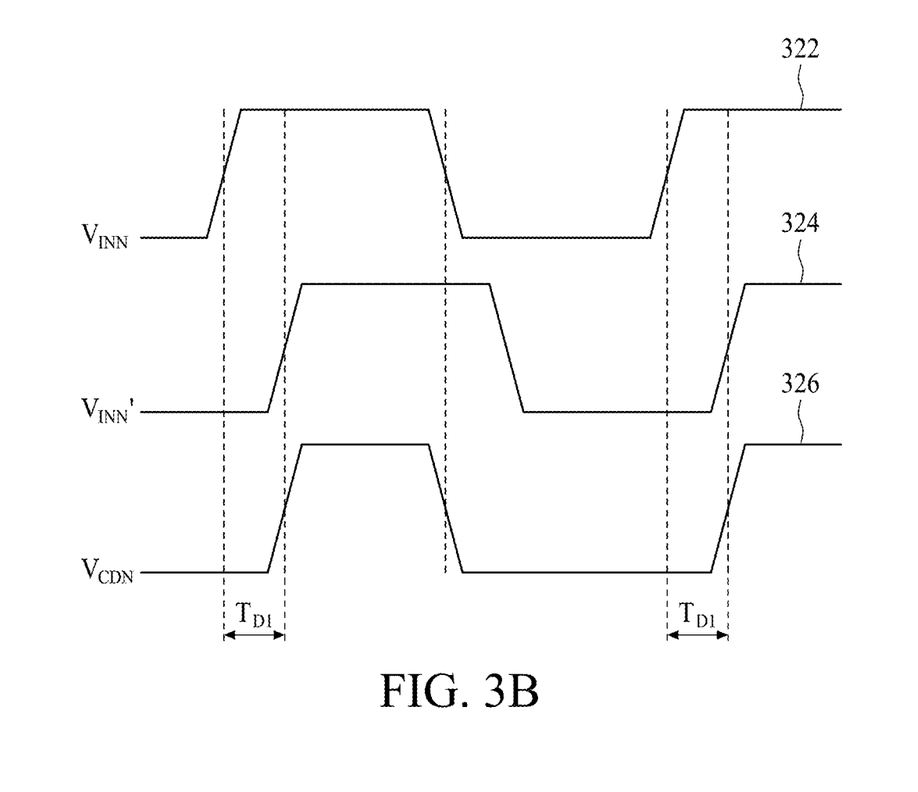
FIG. 3B is a timing diagram of the control circuit of FIG. 3A in accordance with some embodiments.

FIG. 3B is a timing diagram of the control circuit of FIG. 3A in accordance with some embodiments. Curve 322 represents signal $V_{INN}$; curve 324 represents signal $V_{INN}'$; and curve 326 represents signal $V_{CDN}$. As depicted in FIGS. 3A and 3B, delay circuit 312 generates the rising edge of delayed signal $V_{INN}'$ by delaying the corresponding rising edge of signal $V_{INN}$ for a time delay $T_{D1}$. Time delay $T_{D1}$ is set based on the feedback signal $V_{SRN}$. Also, AND gate 314 generates a rising edge of signal $V_{CDN}$ by passing though the corresponding rising edge of signal $V_{INN}'$ and generates a falling edge of signal $V_{CDN}$ by passing though the corresponding falling edge of signal $V_{INN}$. By passing along the falling edge of signal $V_{INN}$ to signal $V_{CDN}$, the voltage level at node 136 (i.e., signal $V_{DN}$) is at least controlled by either driver transistor 132 or contention transistor 166 when signal $V_{IN}$ transitions from logical high value to logical low value.

Figure 4A:
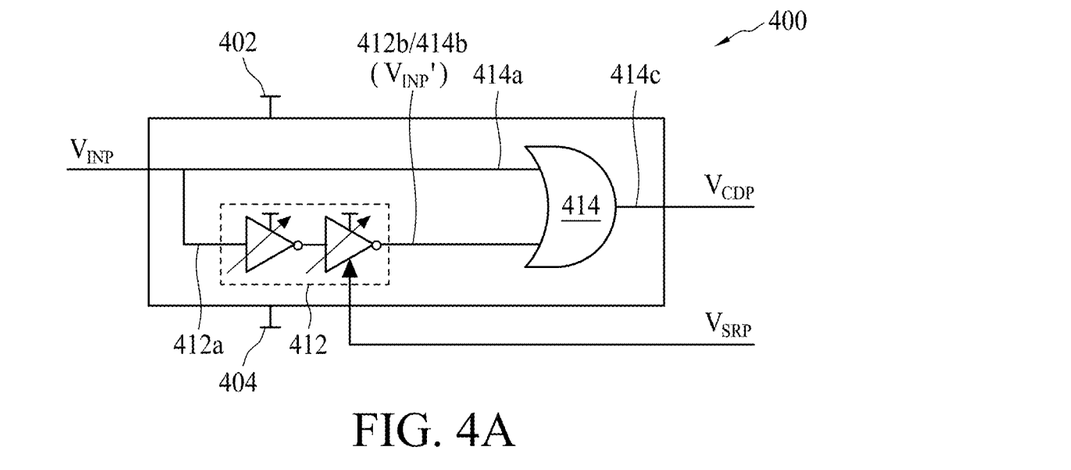
FIG. 4A is a circuit diagram of an example control circuit usable in the I/O circuit of FIG. 1 in accordance with some embodiments.

FIG. 4A is a circuit diagram of another example control circuit 400 usable as control circuit 154 in the I/O circuit of FIG. 1 in accordance with some embodiments. Components that are the same or similar to those depicted in FIG. 1 are given the same reference numbers, and detailed description thereof is thus omitted.

Control circuit 400 includes a first power node 402 and a second power node 404. In some embodiments, power node 402 is configured to receive a voltage having the voltage level the same as that of power node 112 (FIG. 1, $2 \cdot V_{DD}$), and power node 404 is configured to receive a voltage having the voltage level the same as that of power node 116 ($V_{DD}$). Components of control circuit 400 are operated in a power domain defined by power node 402 and power node 404.

Control circuit 400 includes an adjustable delay circuit 412 and an OR gate 414. Adjustable delay circuit 412 has an input node 412a configured to receive signal $V_{INP}$ and an output node 412b. Adjustable delay circuit 412 is configured to generate a delayed signal $V_{INP}'$ by delaying the signal $V_{INP}$ based on the feedback signal $V_{SRP}$. In some embodiments, when the output signal $V_{OUT}$ has a slower slew rate, adjustable delay circuit 412 is set to have a greater delay.

OR gate 414 having a first input 414a, a second input 414b, and an output 414c. First input 414a of the OR gate 414 is configured to receive the signal $V_{INP}$, and second input 414b of the OR gate 414 is configured to receive the delayed signal $V_{INP}'$ from the adjustable delay circuit 412. Output 414c of the OR gate 414 is coupled with, and configured to provide control signal $V_{CDP}$ to, the gate of the contending transistor 156.

Figure 4B:
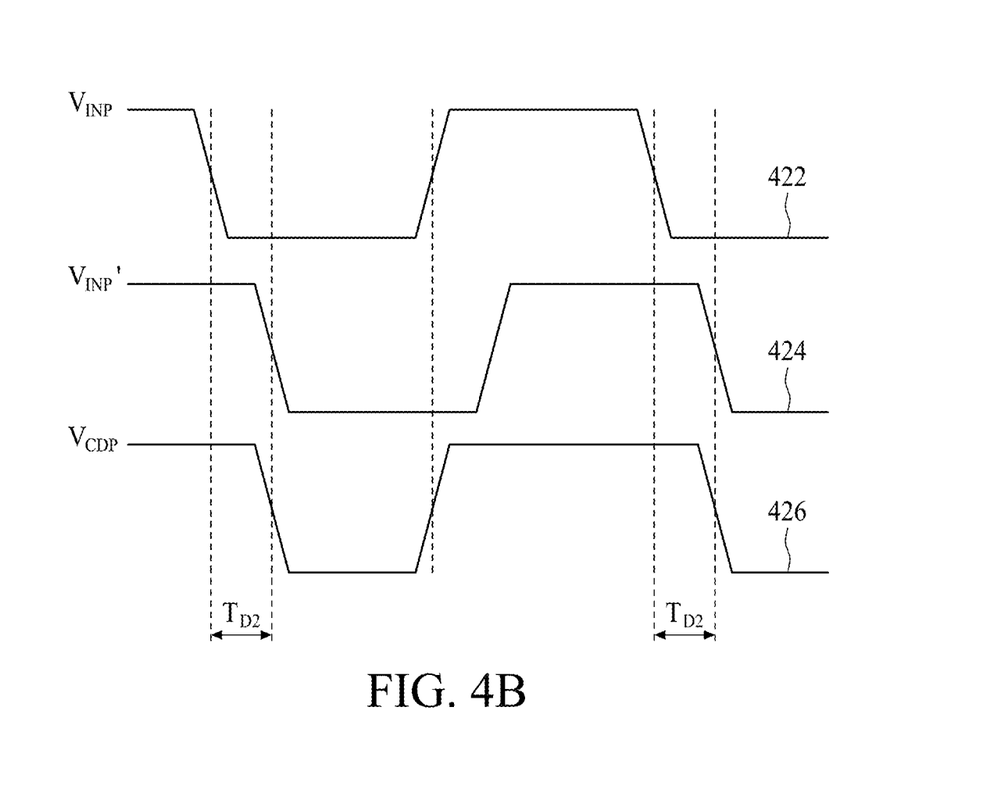
FIG. 4B is a timing diagram of the control circuit of FIG. 4A in accordance with some embodiments.

FIG. 4B is a timing diagram the control circuit of FIG. 4A in accordance with some embodiments. Curve 422 represents signal $V_{INP}$; curve 424 represents signal $V_{INP}'$; and curve 426 represents signal $V_{CDP}$. As depicted in FIGS. 4A and 4B, delay circuit 412 generates the falling edge of delayed signal $V_{INP}'$ by delaying the corresponding falling edge of signal $V_{INP}$ for a time delay $T_{D2}$. Time delay $T_{D2}$ is set based on the feedback signal $V_{SRP}$. Also, OR gate 414 generates a falling edge of signal $V_{CDP}$ by passing though the corresponding falling edge of signal $V_{INP}'$ and generates a rising edge of signal $V_{CDP}$ by passing though the corresponding rising edge of signal $V_{INP}$. By passing along the rising edge of signal $V_{INP}$ to signal $V_{CDP}$, the voltage level at node 126 (i.e., signal $V_{DP}$) is at least controlled by either driver transistor 122 or contention transistor 156 when signal $V_{IN}$ transitions from logical low value to logical high value.

Figure 5A:
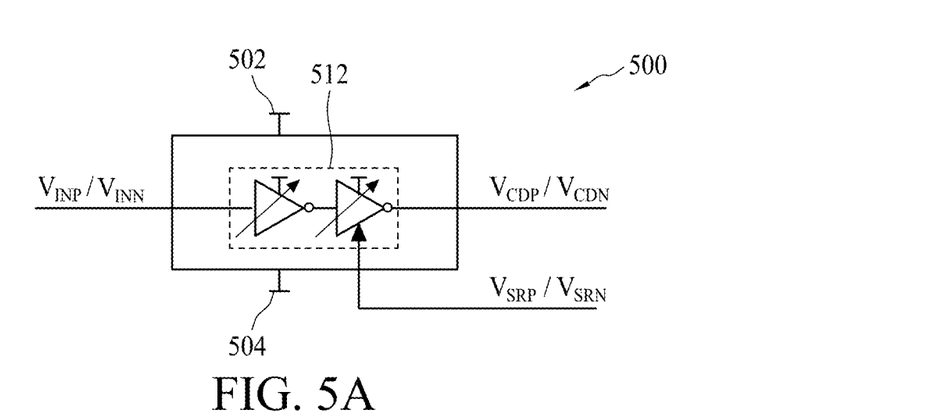
FIG. 5A is a circuit diagram of an example control circuit usable in the I/O circuit of FIG. 1 in accordance with some embodiments.

FIG. 5A is a circuit diagram of another example control circuit 500 usable as control circuit 154 or control circuit 164 in the I/O circuit of FIG. 1 in accordance with some embodiments. Components that are the same or similar to those depicted in FIG. 1 are given the same reference numbers, and detailed description thereof is thus omitted.

Control circuit 500 includes a first power node 502 and a second power node 504. Components of control circuit 500 are operated in a power domain defined by power node 502 and power node 504.

In some embodiments when control circuit 500 is used as control circuit 154, power node 502 is configured to receive a voltage having the voltage level the same as that of power node 112 (FIG. 1, $2 \cdot V_{DD}$), and power node 504 is configured to receive a voltage having the voltage level the same as that of power node 116 ($V_{DD}$). In some embodiments when control circuit 500 is used as control circuit 164, power node 502 is configured to receive a voltage having the voltage level the same as that of power node 118 (FIG. 1, $V_{DD}$), and power node 504 is configured to receive a voltage having the voltage level the same as that of power node 114 (the zero reference level).

Control circuit 500 includes an adjustable delay circuit configured to generate control signal $V_{CDP}$ or $V_{CDN}$ by delaying the corresponding signal $V_{INP}$ or $V_{INN}$ based on the feedback signal $V_{SRP}$ or $V_{SRN}$. In some embodiments, when the output signal $V_{OUT}$ has a slower slew rate, adjustable delay circuit 512 is set to have a greater delay.

Figure 5B:
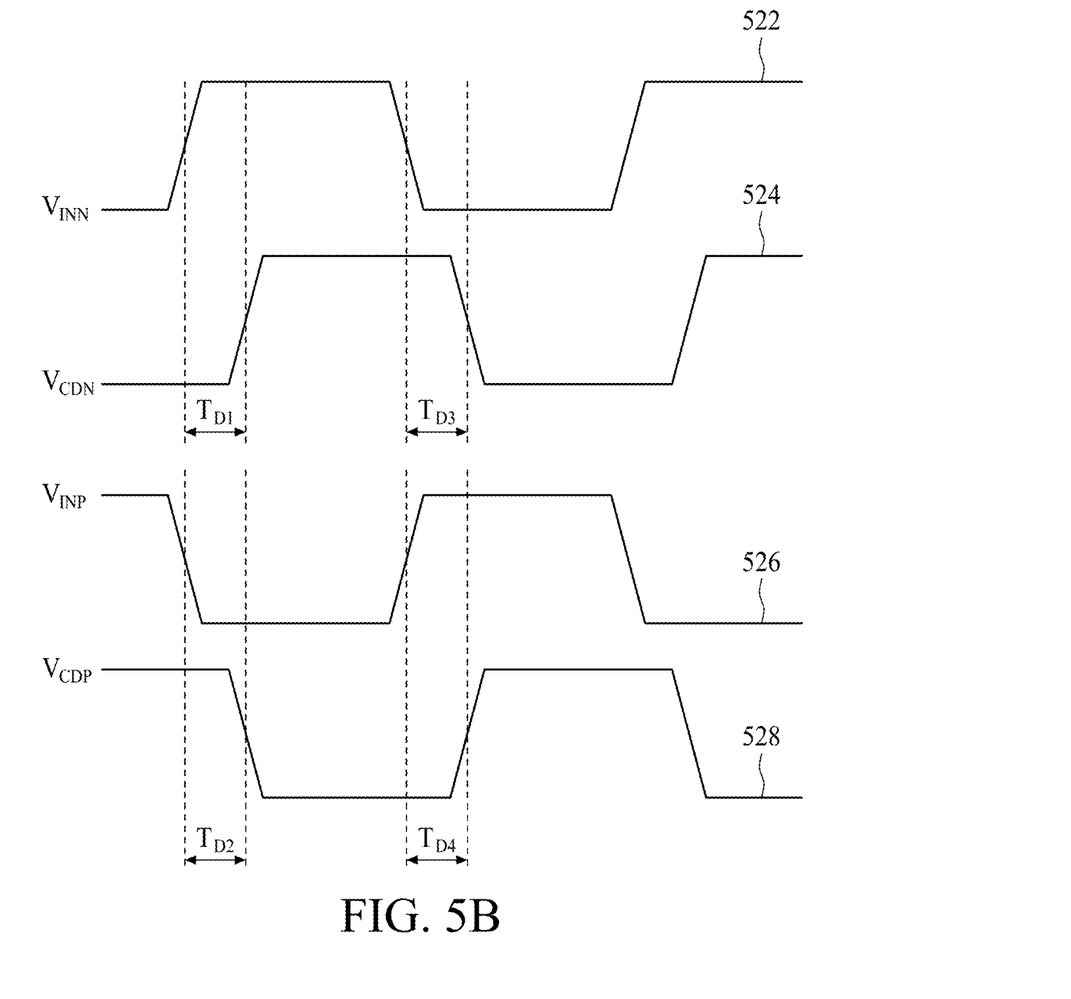
FIG. 5B is a timing diagram the control circuit of FIG. 5A in accordance with some embodiments.

FIG. 5B is a timing diagram the control circuit of FIG. 5A in accordance with some embodiments. Curve 522 represents signal $V_{INN}$ and curve 524 represents signal $V_{CDN}$ when control circuit 500 is used as control circuit 164. Curve 526 represents signal $V_{INP}$ and curve 528 represents signal $V_{CDP}$ when control circuit 500 is used as control circuit 154.

As depicted in FIGS. 5A and 5B, when control circuit 500 is used as control circuit 164, control circuit 500 generates the rising edge of signal $V_{CDN}$ by delaying the corresponding rising edge of signal $V_{INN}$ for a time delay $T_{D1}$ and generates the falling edge of signal $V_{CDN}$ by delaying the corresponding falling edge of signal $V_{INN}$ for a time delay $T_{D3}$. Time delays $T_{D1}$ and $T_{D3}$ are set based on the feedback signal $V_{SRN}$. Compared with using control circuit 300, both driver transistor 132 and contention transistor 166 are turned off during the time period $T_{D3}$, and thus node 136 is temporarily set to be electrically floating.

Moreover, when control circuit 500 is used as control circuit 154, control circuit 500 generates the falling edge of signal $V_{CDP}$ by delaying the corresponding falling edge of signal $V_{INP}$ for a time delay $T_{D2}$ and generates the rising edge of signal $V_{CDP}$ by delaying the corresponding rising edge of signal $V_{INP}$ for a time delay $T_{D4}$. Time delays $T_{D2}$ and $T_{D4}$ are set based on the feedback signal $V_{SRP}$. Compared with using control circuit 400, both driver transistor 122 and contention transistor 156 are turned off during the time period $T_{D4}$, and thus node 126 is temporarily set to be electrically floating.

Figure 6:
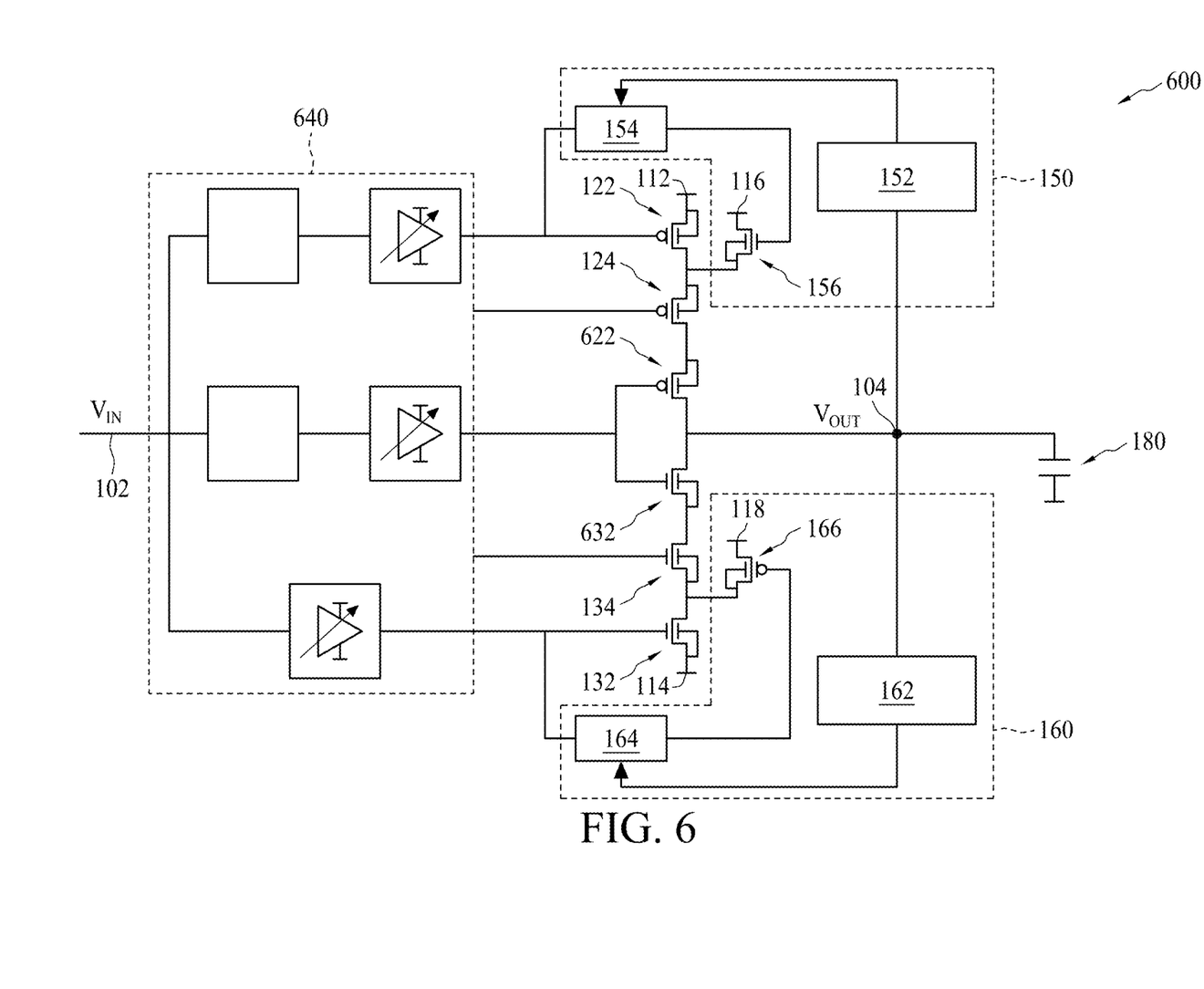
FIG. 6 is a circuit diagram of an example I/O circuit in accordance with some embodiments.

FIG. 6 is a circuit diagram of another example I/O circuit 600 in accordance with some embodiments. Components that are the same or similar to those depicted in FIG. 1 are given the same reference numbers, and detailed description thereof is thus omitted.

Compared with I/O circuit 100, circuit 600 further includes a P-type driver transistor 622 between output node 104 and driver transistor 124; an N-type driver transistor 632 between output node 104 and driver transistor 134; and a biasing circuit 640 replacing biasing circuit 140. Output signal $V_{OUT}$ has a voltage level ranging from the zero reference level to a predetermined voltage level $3 \cdot V_{DD}$. Power node 112 is configured to receive a voltage having a voltage level of $3 \cdot V_{DD}$. Power node 116 is configured to receive a voltage having a voltage level of $2 \cdot V_{DD}$.

Biasing circuit 640 is coupled with input node 102 and gates of driver transistors 122, 124, 622, 132, 134, and 632. Biasing circuit 640 is configured to turn off driver transistors 122, 124, and 622 and turn on driver transistors 132, 134, and 632 responsive to input signal $V_{IN}$ being at the logical high value; and to turn on driver transistors 122, 124, and 622 and turn off driver transistors 132, 134, and 632 responsive to input signal $V_{IN}$ being at the logical low value. In some embodiments, biasing circuit 640 outputs an up-shifted signal ranging from $2 \cdot V_{DD}$ to $3 \cdot V_{DD}$ to the gate of driver transistor 122; an up-shifted, inverted, signal ranging from $2 \cdot V_{DD}$ to $V_{DD}$ to the gates of driver transistor 622 and 632; and a signal ranging from 0 to $V_{DD}$ to the gate of driver transistor 132. In some embodiments, biasing circuit 640 outputs $2 \cdot V_{DD}$ to the gate of driver transistor 124 and $V_{DD}$ to the gate of driver transistor 134.

The operation of contending circuits 150 and 160 in I/O circuit 600 are similar to the operation of contending circuits 150 and 160 in I/O circuit 100, and detailed description is thus omitted.

Figure 7:
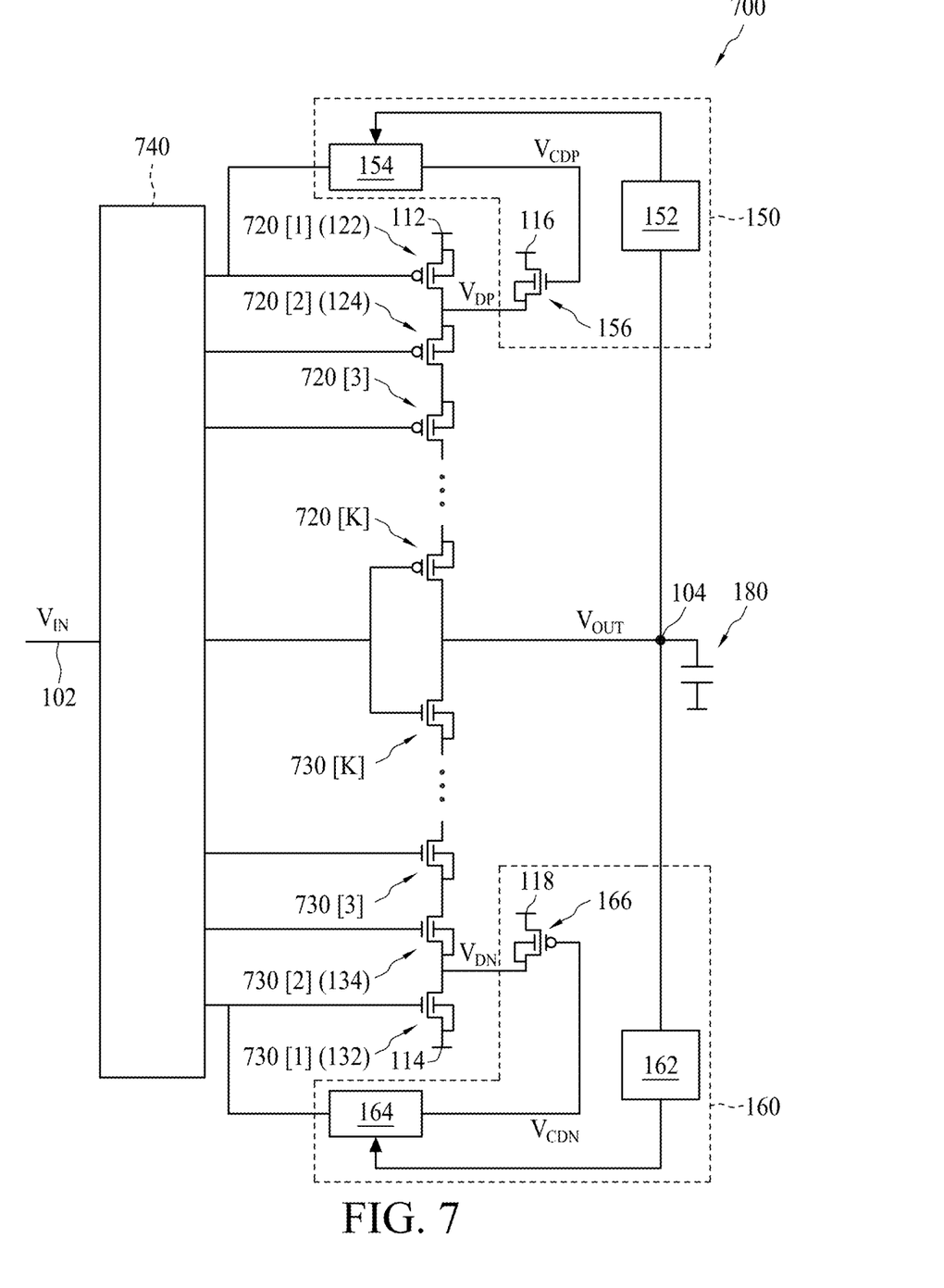
FIG. 7 is a circuit diagram of an example I/O circuit in accordance with some embodiments.

FIG. 7 is a circuit diagram of another example I/O circuit 700 in accordance with some embodiments. Components that are the same or similar to those depicted in FIG. 1 are given the same reference numbers, and detailed description thereof is thus omitted.

Compared with I/O circuit 100, circuit 700 includes K P-type cascode driver transistors 720[1], 720[2], 720[3], . . . , 720[K] coupled in series between power node 112 and output node 104; K N-type cascode driver transistors 730[1], 730[2], 730[3], . . . , 730[K] coupled in series between power node 114 and output node 104; and a biasing circuit 740 replacing biasing circuit 140. Output signal $V_{OUT}$ has a voltage level ranging from the zero reference level to a predetermined voltage level $K \cdot V_{DD}$. Power node 112 is configured to receive a voltage having a voltage level of $K \cdot V_{DD}$. Power node 116 is configured to receive a voltage having a voltage level of $(K-1) \cdot V_{DD}$. K is a positive ratio greater than 1. In some embodiments when K is set to be 2, circuit 700 becomes the same as I/O circuit 100, where driver transistor 720[1] corresponds to driver transistor 122; driver transistor 720[2] corresponds to driver transistor 124; driver transistor 730[1] corresponds to driver transistor 132; and driver transistor 730[2] corresponds to driver transistor 134.

Biasing circuit 740 is coupled with input node 102 and gates of driver transistors 720[1], 720[2], 720[3], . . . , 720[K], 730[1], 730[2], 730[3], . . . , and 730[K]. Biasing circuit 740 is configured to turn off driver transistors 720 and turn on driver transistors 730 responsive to input signal $V_{IN}$ being at the logical high value; and to turn on driver transistors 720 and turn off driver transistors 730 responsive to input signal $V_{IN}$ being at the logical low value. The operation of contending circuits 150 and 160 in I/O circuit 700 are similar to the operation of contending circuits 150 and 160 in I/O circuit 100, and detailed description is thus omitted.

Figure 8:
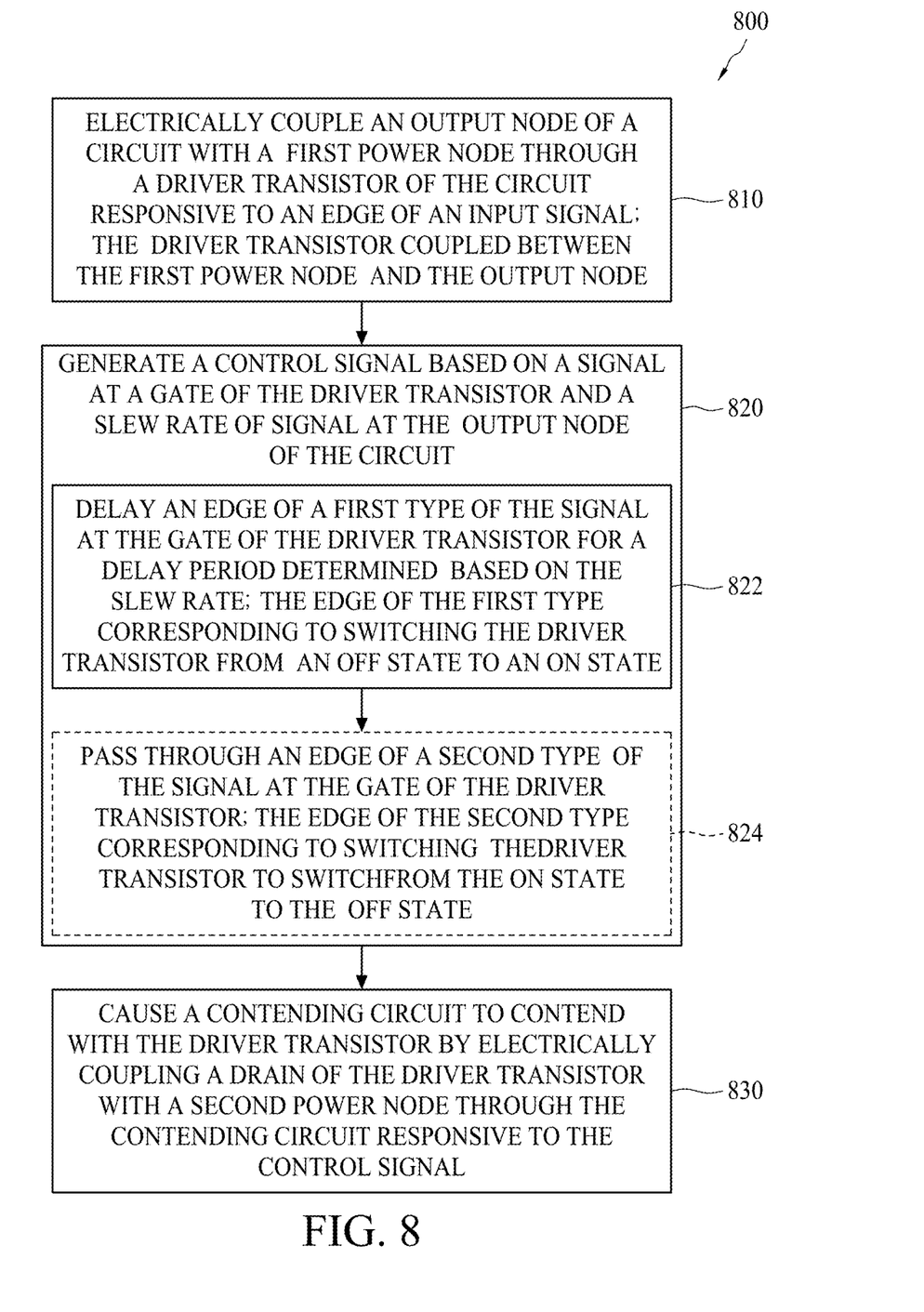
FIG. 8 is a flow chart of a method of operating an I/O circuit in accordance with some embodiments.

FIG. 8 is a flow chart of a method 800 of operating an I/O circuit in accordance with some embodiments. To facilitate the explanation of method 800, I/O circuit 100 is referred to as an example. However, method 800 is also applicable to I/O circuit 600 or 700. It is understood that additional operations may be performed before, during, and/or after the method 800 depicted in FIG. 8, and that some other processes may only be briefly described herein.

As depicted in FIG. 8 and FIG. 1, the process 800 begins with operation 810, where an output node is electrically coupled with a power node through a driver transistor responsive to an edge of an input signal. For example, if input signal $V_{IN}$ transitions from the zero reference level to $V_{DD}$, output node 104 is electrically coupled with power node 114 through driver transistor 132. Also, if input signal $V_{IN}$ transitions from $V_{DD}$ to the zero reference level, output node 104 is electrically coupled with power node 112 through driver transistor 122.

The process 800 proceeds to operation 820, where a control signal $V_{CDP}$ or $V_{CDN}$ is generated based on a signal $V_{INP}$ or $V_{INN}$ at a gate of the driver transistor 122 or 132 and a slew rate of a signal $V_{OUT}$ at the output node 104.

Operation 820 includes operation 822 and operation 824. In operation 822, a falling edge of signal $V_{CDP}$ is generated by delaying a corresponding falling edge of signal $V_{INP}$ for a delay period $T_{D2}$, and the delay period $T_{D2}$ is determined based on the slew rate of a rising edge of signal $V_{OUT}$. Also, in operation 822, a rising edge of signal $V_{CDN}$ is generated by delaying a corresponding rising edge of signal $V_{INN}$ for a delay period $T_{D1}$, and the delay period $T_{D1}$ is determined based on the slew rate of a falling edge of signal $V_{OUT}$.

In operation 824, when control circuit 400 in FIG. 4 is being used, a rising edge of signal $V_{CDP}$ is generated by passing through a corresponding rising edge of signal $V_{INP}$, and thus avoiding further delaying rising edge of signal $V_{CDP}$ as compared with the corresponding rising edge of signal $V_{INP}$. Also, in operation 824, when control circuit 300 in FIG. 3 is being used, a falling edge of signal $V_{CDN}$ is generated by passing through a corresponding falling edge of signal $V_{INN}$, and thus avoiding further delaying falling edge of signal $V_{CDN}$ as compared with the corresponding falling edge of signal $V_{INN}$.

In some embodiments when control circuit 500 in FIG. 5 is being used instead of control circuit 300 and control circuit 400, operation 824 is omitted.

The process 800 proceeds to operation 830, where a contending circuit is caused to contend with the driver transistor by electrically coupling a drain of the driver transistor with another power node through the contending circuit responsive to the control signal. For example, when driver transistor 122 is turned on to pull signal $V_{DP}$ toward $K \cdot V_{DD}$ at power node 112, control signal $V_{CDP}$ causes contending transistor 156 to pull signal $V_{DP}$ toward $(K-1) \cdot V_{DD}$ during the delay period $T_{D2}$. Also, when driver transistor 132 turned on to pull signal $V_{DN}$ toward the zero reference level at power node 114, control signal $V_{CDN}$ causes contending transistor 166 to pull signal $V_{DN}$ toward $V_{DD}$ during the delay period $T_{D1}$.

In some embodiments, a circuit includes a first power node configured to carry a first voltage having a first voltage level, an output node, a node coupled between the first power node and the output node, and a contending transistor coupled between the node and a second power node configured to carry a second voltage having a second voltage level. The circuit is configured to generate a signal at the output node that ranges between the first voltage level and a third voltage level, the contending transistor is configured to couple the node with the second power node responsive to the signal, a difference between the first voltage level and the second voltage level has a first magnitude, a difference between the first voltage level and the third voltage level has a second magnitude, and the second magnitude is a multiple of the first magnitude having a value greater than one.

In some embodiments, a method includes generating a signal at an output node of a circuit, the signal ranging between a first voltage level carried on a first power node and a second voltage level, and, responsive to the signal, electrically coupling a node between the output node and the first power node to a second power node carrying a third voltage level. A difference between the first voltage level and the second voltage level has a first magnitude, a difference between the first voltage level and the third voltage level has a second magnitude, and the first magnitude is a multiple of the second magnitude having a value greater than one.

Various types of transistors are discussed in this disclosure as example. In some embodiments, the implementations using other types of transistors different from those illustrated in the present disclosure are within the scope of the subject application.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a first power node configured to carry a first voltage having a first voltage level;
   an output node;
   first and second cascode transistors coupled between the first power node and the output node and to each other at a node;
   a bias circuit configured to use the first and second cascode transistors to generate a signal at the output node that ranges between the first voltage level and a third voltage level;
   a control circuit configured to generate a first control signal based on the signal; and
   a contending transistor configured to, responsive to the first control signal, couple the node to a second power node configured to carry a second voltage having a second voltage level,
   wherein
     a difference between the first voltage level and the second voltage level has a first magnitude,
     a difference between the first voltage level and the third voltage level has a second magnitude, and
     the second magnitude is a multiple of the first magnitude having a value greater than one.

2. The circuit of claim 1, further comprising an input node configured to receive an input signal having a voltage range corresponding to the first magnitude, wherein the circuit is configured to generate the signal at the output node responsive to the input signal.

3. The circuit of claim 2, wherein
   the bias circuit is configured to:
     generate a second control signal based on the input signal, and
     couple the node with the first power node responsive to the second control signal,
   the control circuit comprises an adjustable delay circuit configured to generate a delayed signal based on the second control signal, and
   the control circuit is configured to generate the first control signal responsive to the delayed signal.

4. The circuit of claim 3, wherein
   the adjustable delay circuit is configured to generate the delayed signal by applying a delay to the second control signal, and
   the delay is a function of a capacitive load at the output node.

5. The circuit of claim 4, wherein the delay depends on a driving capability of the first cascode transistor configured to couple the node with the first power node.

6. The circuit of claim 3, wherein the adjustable delay circuit is configured to operate in a power domain defined by the first power node and the second power node.

7. The circuit of claim 3, wherein the control circuit further comprises a logic gate configured to generate the first control signal based on the second control signal and the delayed signal, wherein the contending transistor is configured to receive the first control signal.

8. The circuit of claim 1, wherein
the first cascode transistor is coupled between the node and the first power node,
the contending transistor is one type of an N-type transistor or a P-type transistor, and
the first cascode transistor is the other type of the N-type transistor or the P-type transistor.

9. The circuit of claim 8, wherein the contending transistor has a driving capability equal to or less than a driving capability of the first cascode transistor.

10. A method comprising:
using a bias circuit to control first and second cascode transistors coupled between a first power node and an output node of a circuit, thereby generating a signal at the output node, the signal ranging between a first voltage level carried on the first power node and a second voltage level;
responsive to the signal, generating a control signal using a control circuit; and
responsive to the control signal, using a contending transistor to electrically couple a node between the first and second cascode transistors to a second power node carrying a third voltage level,
wherein,
a difference between the first voltage level and the second voltage level has a first magnitude,
a difference between the first voltage level and the third voltage level has a second magnitude, and
the first magnitude is a multiple of the second magnitude having a value greater than one.

11. The method of claim 10, further comprising, responsive to the control signal, using the contending transistor to electrically decouple the node from the second power node following a delay period.

12. The method of claim 11, wherein the using the contending transistor to electrically decouple the node from the second power node comprises controlling the delay period based on a capacitive load at the output node.

13. The method of claim 10, wherein the generating the signal comprises using the first cascode transistor to electrically couple the node with the first power node while the node is electrically coupled with the second power node.

14. The method of claim 10, further comprising using the contending transistor to electrically couple the node with the second power node while using the first cascode transistor to electrically decouple the node from the first power node.

15. The method of claim 10, further comprising using the contending transistor to electrically couple the node with the second power node after using the first cascode transistor to electrically decouple the node from the first power node.

16. A circuit comprising:
a first power node configured to carry a first voltage having a first voltage level;
a second power node configured to carry a second voltage having a second voltage level;
an output node;
first and second cascode transistors coupled between the first power node and the output node and to each other at a first node;
third and fourth cascode transistors coupled between the output node and the second power node and to each other at a second node;
a bias circuit configured to use the first through fourth cascode transistors to generate a signal at the output node that ranges between the first voltage level and the second voltage level;
first and second control circuits configured to generate respective first and second control signals based on the signal;
a first contending transistor configured to, responsive to the first control signal, couple the first node to a third power node configured to carry a third voltage having a third voltage level; and
a second contending transistor configured to, responsive to the second control signal, couple the second node to a fourth power node configured to carry a fourth voltage having a fourth voltage level,
wherein
each of a difference between the first voltage level and the third voltage level and a difference between the second voltage level and the fourth voltage level has a first magnitude,
a difference between the first voltage level and the second voltage level has a second magnitude, and
the second magnitude is a multiple of the first magnitude having a value greater than one.

17. The circuit of claim 16, wherein the third voltage level is the same as the fourth voltage level.

18. The circuit of claim 16, wherein
the first voltage level is greater than the second voltage level,
the first contending transistor is an N-type transistor, and
the second contending transistor is a P-type transistor.

19. The circuit of claim 16, further comprising an input node configured to receive an input signal having a voltage range corresponding to the first magnitude, wherein the circuit is configured to, responsive to the input signal:
for a first delay period, use the first cascode transistor to couple the first node with the first power node while the first node is coupled with the third power node by the first contending transistor, and
for a second delay period, use the third cascode transistor to couple the second node with the second power node while the second node is coupled with the fourth power node by the second contending transistor.

20. The circuit of claim 19, wherein each of the first delay period and the second delay period is a function of a capacitive load at the output node.

* * * * *